(12) United States Patent
Park

(10) Patent No.: US 6,849,922 B2
(45) Date of Patent: Feb. 1, 2005

(54) ORGANIC ELECTRO-LUMINESCENT DISPLAY DEVICE AND METHOD OF FABRICATING THE SAME

(75) Inventor: Jae-Yong Park, Kyonggi-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 29 days.

(21) Appl. No.: 10/608,532

(22) Filed: Jun. 30, 2003

(65) Prior Publication Data
US 2004/0041147 A1 Mar. 4, 2004

(30) Foreign Application Priority Data
Aug. 31, 2002 (KR) ................................ 10-2002-052338

(51) Int. Cl.⁷ .............................................. H01L 23/58
(52) U.S. Cl. ...................... 257/633; 257/669; 257/747; 438/50; 438/51; 438/106
(58) Field of Search ................................ 257/108, 178, 257/417, 418, 419, 633, 669, 747; 438/50, 51, 106

(56) References Cited

U.S. PATENT DOCUMENTS
5,955,380 A * 9/1999 Lee ............................ 438/706
6,380,558 B1 * 4/2002 Yamazaki et al. ............ 257/57

FOREIGN PATENT DOCUMENTS
JP 04152656 A * 5/1992 ............ H01L/21/90
JP 2004063304 A * 2/2004 ............ H05B/33/10

* cited by examiner

*Primary Examiner*—Paul E Brock, II
(74) *Attorney, Agent, or Firm*—Morgan, Lewis & Bockius LLP

(57) ABSTRACT

An organic electro-luminescent display device and a method of fabricating the same are disclosed in the present invention. The organic electro-luminescent display device includes a plurality of pixels on a substrate, a thin film transistor coupled to each pixel, an organic electro-luminescent device coupled to the thin film transistor, a packaging layer on the organic electro-luminescent device, wherein the packaging layer comprises first and second inorganic layers having opposite stresses, and a first organic layer between the first and second inorganic layers.

18 Claims, 5 Drawing Sheets

ORGANIC ELECTRO-LUMINESCENT DISPLAY DEVICE AND METHOD OF FABRICATING THE SAME

This application claims the benefit of the Korean Patent Application No. P2002-052338 filed on Aug. 31, 2002, which is hereby incorporated by reference.

BACKGROUND OF THE INVENTION

1. Field of the Invention

The present invention relates to a flat display display device, and more particularly, to an organic electro-luminescent display device and a method of fabricating the same. Although the present invention is suitable for a wide scope of applications, it is particularly suitable for effectively protecting the organic electro-luminescent device from the oxygen or the moisture.

2. Discussion of the Related Art

With the advent of the information age of high technology due to the development of information communication and computers, many display devices are extensively used. A cathode ray tube (CRT) which makes a fluorescent body to be luminescent by emitting electrons from an electron gun, such as a television, is a display for a desk top computer, and about one hundred million cathode ray tubes are in demand each year. A liquid crystal display (LCD) device for a notebook computer is also used for a monitor or a digital camera. The LCD device is not a spontaneous emitting device, so that it reproduces an image by the light of a backlight. However, the CRT and EL device are spontaneous emitting types. Especially, the EL device is divided into an organic EL type and an inorganic EL type according to the fluorescent compound used for an emitting layer.

Further, the inorganic EL device is divided into a dispersion type and a thin film type, which are all accelerated since electrons in the fluorescent body is located below the high electric field. Accordingly, a collision is generated at the center of the emission. The currently used inorganic EL is almost operated by an alternating current, and brightness is dependent on voltage and frequency. In the meantime, the organic EL device injects electrons and holes from the outside, and emits light by the re-combination energy of the electrons and the holes.

When applied as a display, an organic EL device has a wider viewing angle, a higher contrast, and more excellent visibility than an LCD device, since the organic EL device is a spontaneous emitting type device. Also, since the backlight is not required, the organic EL device can be fabricated in slim and light size. The organic EL device can be operated with a low voltage of direct current, so that a moving picture can be displayed due to a fast response speed. Nowadays, the organic EL device is in a spotlight for the IMT-2000 display, and has a wide operation temperature range, since it is solid and has a strong vibration resistance. Especially, in the organic EL device, a current is applied only to pixels requiring an emission. Accordingly, as compared to the LCD device, which always has to turn on the backlight on the entire surface, the organic EL device has a much lower power consumption regardless of the display contents.

The organic EL display device has a cathode electrode and an anode electrode facing into each other on a transparent substrate, such as a glass substrate. By applying a voltage between the cathode electrode and the anode electrode, a light is emitted from an organic emitting layer. At this time, the anode electrode is formed by indium-tin-oxide (ITO) having an excellent conductivity and a light transmissivity, so that the light emitted from the organic emitting layer can be transmitted well and holes can be easily supplied. Also, the cathode electrode is formed by a metal having a low work function, so that electrons can be easily supplied.

Accordingly, if (+) voltage and (−) voltage are respectively applied to the anode electrode and the cathode electrode, the holes injected from the anode electrode and the electrons injected from the cathode electrode are re-combined in the organic emitting layer, thereby emitting light.

In the meantime, the organic luminescent device has a plurality of unit pixels arranged as a matrix form, and selectively drives the organic emitting layer of the unit pixels by a thin film transistor provided at each unit pixel, thereby displaying an image.

The organic emitting layer of the organic luminescent device is composed of a hole transport layer, an electron transport layer, and an organic emitting layer formed between the hole transport layer and the electron transport layer. At this time, the organic layer is very sensitive to moisture, oxygen in the air, and temperature, and if contacted to the moisture and oxygen, the structure is changed, thereby degrading emitting efficiency.

Accordingly, an encapsulation process for forming a packaging plate is performed to isolate the organic luminescent device from the moisture and oxygen.

FIGS. 1 and 2 are structures of an organic EL display device in accordance with the related art.

A related art organic EL display device comprises a thin film transistor TFT, an organic electro-luminescent device, and a capacitor (Cst).

More specifically, the thin film transistor TFT comprises an active layer 120, a gate electrode 130, source and drain electrodes 160 and 150 at source and drain regions 123B and 123A formed at both sides of the active layer 120, and a gate insulating layer 123 formed between the gate electrode 130 and the active layer 120 for insulation therebetween. And, a barrier layer 101 is formed on the entire surface of the glass substrate 100 for preventing a foreign substance from adhering to the TFT from the substrate 100, a passivation layer 128 including the source/drain electrodes 160 and 150, and second and third interlayer 127 and 129 is formed on the TFT.

The electro-luminescent device comprises a transparent electrode 170 electrically connected to the drain electrode 150 of the TFT, an organic emitting layer 172 formed on the transparent electrode 170 and having a hole transport layer, an emitting layer, and an electron transport layer, and an opaque electrode 175 formed on the organic emitting layer 172.

The capacitor Cst comprises a power line 140, a polycrystalline silicon layer 121, and a first interlayer 125 between the power line 140 and the polycrystalline silicon layer 121. Also, a sealant 108 is formed at the outer skirt of the substrate on which the TET, the organic luminescent device, and the capacitor are formed, and by the sealant 108, a packaging plate 107 is attached to the substrate 100.

The packaging plate 107 shields moisture and oxygen penetrated into the organic EL device from the outside, and has an absorbent 106 attached by a semi-transmitting film 105 therein.

The absorbent 106 of BaO, $CaCO_3$, CaO, InO, zeolite, silicagel, alumina, and so on, is exposed to moisture and then removes the moisture by a chemical reaction. The sealant 108 of epoxy resin seals the glass substrate 100 and the packaging plate 107.

Also, as a packaging plate, a metal plate 107 can be used, as shown in FIG. 1. Alternatively, a glass substrate 111a can be used, as shown in FIG. 2. In case of using the metal plate 107 as a packaging plate, if the area of the metal plate in which the absorbent has to be mounted becomes wide, it is hard to evenly form the metal plate. Also, in order to evenly form the metal plate, the metal plate has to be thick, and if the thickness of the metal plate is increased, the device becomes heavy and large.

Also, in case of using a glass substrate as a packaging plate, the glass substrate has to be cut concavely towards an inner direction in order to mount the absorbent. However, the cutting depth of the glass substrate is limited due to a mechanical strength thereof, so that mounting the absorbent is improper. Also, in case of using a thick glass substrate in order to improved the mechanical strength, the organic EL display device is increased in weight and size.

In order to resolve such problems and to reduce a production cost, a hermetic sealing method in which a passivation layer is used as the packaging plate has been researched. The passivation layer used as the packaging plate has to be transparent, humidity resistant, heat resistant, and low in stress. Also, the passivation layer has to be formed at a low temperature. To meet such characteristics, one of an inorganic layer, an organic layer, and hybrid is used as the packaging plate. However, in case of the inorganic layer, the formation rate of a thin film is slow, thereby degrading productivity. Also, since a stress is high, it is increased as the layer becomes thick. Accordingly, the internal structure of the layer is changed, so that moisture can be penetrated into the layer.

Also, in case of the organic layer, even if the organic layer has advantages of an easy layer formation and a lower stress, moisture can exist after the layer formation. Accordingly, a complete moisture shielding is difficult when only the organic layer is used.

Also, such a single layer has a pinhole, through which the moisture or oxygen is penetrated.

Therefore, in the related art, a hybrid structure, in which the organic layer and the inorganic layer are deposited, is used.

FIG. 3 shows an organic EL display device in which a passivation layer of the hybrid structure is applied in accordance with the related art.

As shown in FIG. 3, a conventional packaging layer 180 is formed by combining an organic layer and an inorganic layer. In case of applying a hybrid structure, pinholes 181 formed at each layer are conflicting, so that a penetration path of moisture and oxygen is lengthened to preserve a life span of the organic luminescent device.

However, the hybrid structure cannot completely shield the moisture penetration, since is it difficult to maintain the stress balance of a thin film due to the mixture of the organic layer and the inorganic layer, and the substrate is bent due to the stress. The bent substrate causes an opening of the lines formed on the substrate, such as a gate line, a data line, a power line and so on.

SUMMARY OF THE INVENTION

Accordingly, the present invention is directed to an organic electro-luminescent display device and a method of fabricating the same that substantially obviate one or more of problems due to limitations and disadvantages of the related art.

Another object of the present invention is to provide an organic electro-luminescent display device and a method of fabricating the same, which can effectively shield an organic electro-luminescent device from the oxygen or moisture.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electro-luminescent display device includes a plurality of pixels on a substrate, a thin film transistor coupled to each pixel, an organic electro-luminescent device coupled to the thin film transistor, a packaging layer on the organic electro-luminescent device, wherein the packaging layer comprises first and second inorganic layers having opposite stresses, and a first organic layer between the first and second inorganic layers.

In another aspect of the present invention, an organic electro-luminescent display device includes a plurality of pixels on a substrate, a thin film transistor coupled to each pixel, the thin film transistor having a gate electrode, an active layer, and source/drain electrodes, a capacitor having a power line connected to the source electrode, a polycrystalline silicon layer, and an insulating layer between the source electrode and the polycrystalline silicon layer, an organic electro-luminescent device having a first electrode connected to the drain electrode, a second electrode over the first electrode, and an organic emitting layer between the first and second electrodes a first organic layer on the second electrode, a first inorganic layer on the first organic layer, a second organic layer formed of one or more layers on the first inorganic layer, a second inorganic layer on the second organic layer and formed of a same material as the first inorganic layer, wherein the first and second inorganic layers have opposite stresses, and a third organic layer formed of one or more layers formed on the second inorganic layer.

In a further aspect of the present invention, a method for fabricating an organic electro-luminescent device includes forming a thin film transistor having an active layer, source/drain electrodes, and a gate electrode, and a storage capacitor having a storage lower electrode, an interlayer insulation layer, and a power line, on a transparent substrate, forming a passivation layer exposing portions of the drain electrode, the source electrode, and the power line, forming an organic electro-luminescent device having a first electrode, an organic emitting layer, and a second electrode on the passivation layer, forming a first organic layer on the second electrode, forming a first inorganic layer on the first organic layer, forming a second organic layer formed of one or more layers on the first inorganic layer, forming a second inorganic layer on the second organic layer, the second inorganic layer formed of a same material as the first inorganic layer, wherein the first and second inorganic layers have opposite stresses, and forming a third organic layer formed of one or more layers on the second inorganic layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incor- In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

Figure 1:
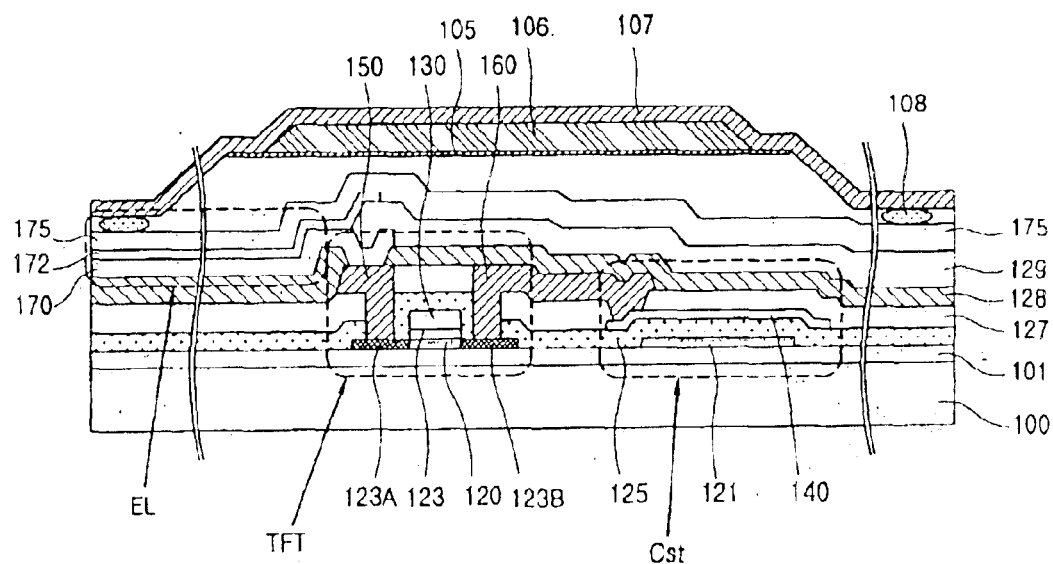
FIG. 1 is a cross-sectional view of an encapsulated organic electro-luminescent display device using a metal plate as a packaging plate according to the related art.
Figure 2:
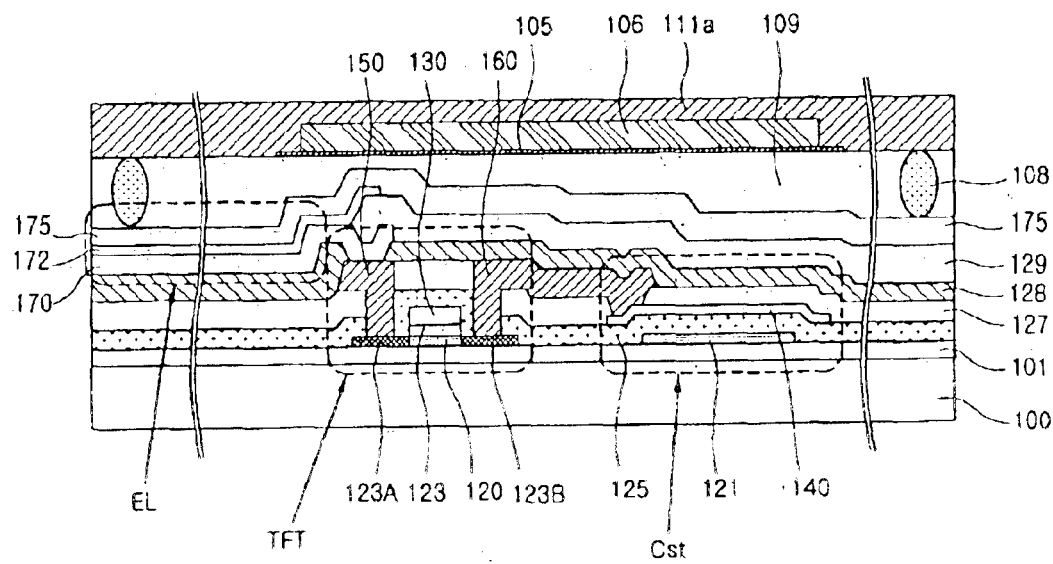
FIG. 2 is a cross-sectional view of an encapsulated organic electro-luminescent display device using a glass plate as a packaging plate according to the related art.
Figure 3:
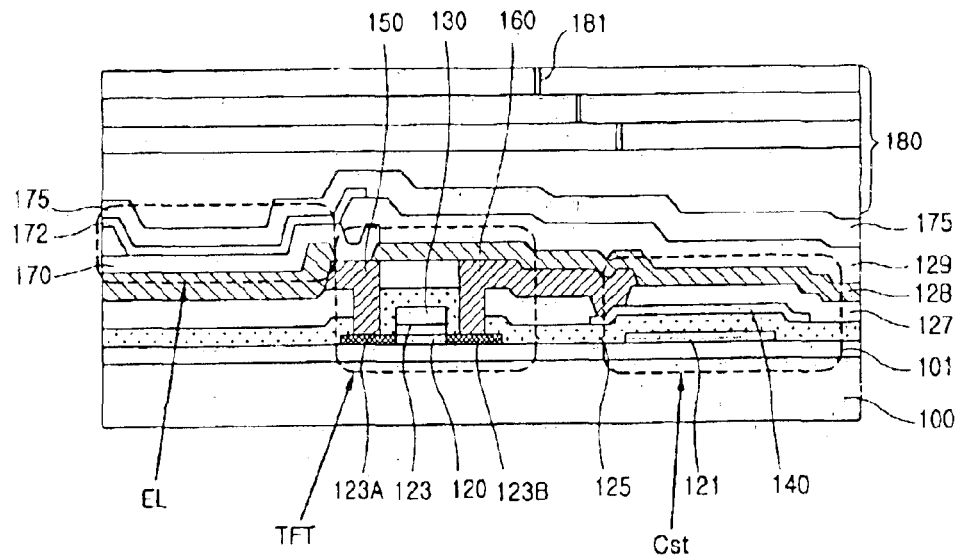
FIG. 3 is a cross-sectional view of an organic electro-luminescent display device using a packaging plate in which an organic layer and an inorganic layer are alternately deposited according to the related art.
Figure 4:
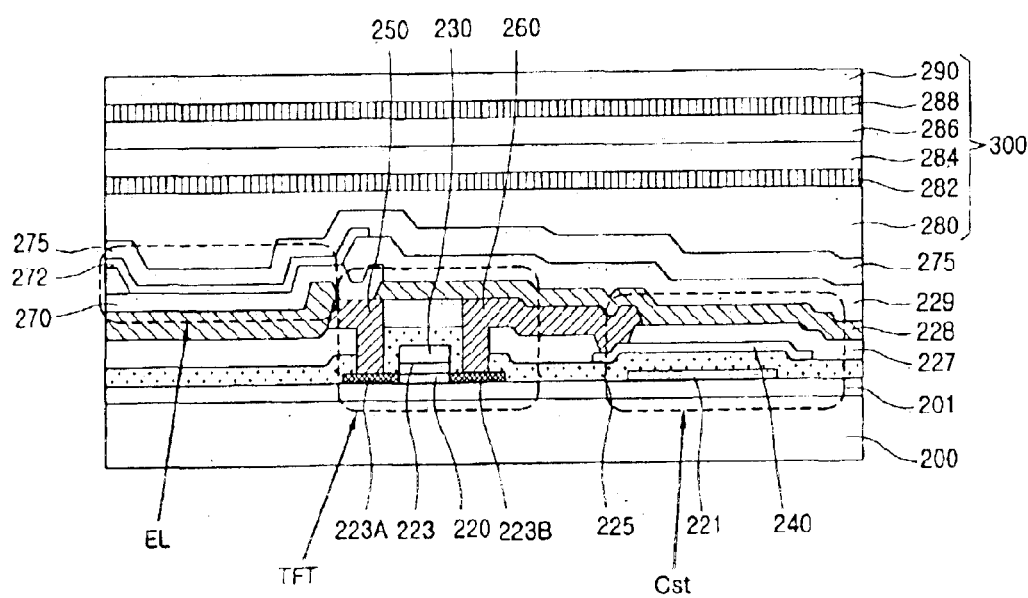
FIG. 4 is a cross-sectional view of an organic electro-luminescent display device according to the present invention.

FIG. 4 is a cross-sectional view of an organic electro-luminescent display device according to the present invention.

As shown in FIG. 4, an organic EL display device according to the present invention includes a thin film transistor TFT on a substrate 200, a capacitor Cst, an organic EL device, and a packaging layer 300.

The thin film transistor TFT includes an active layer 220 formed of a polycrystalline silicon, source and drain regions 223B and 223A doped with n-type impurities, such as P or As, or p-type impurities of B with a high concentration at both sides of the active layer 220, a gate electrode 230 formed on the gate insulation layer 223 on the active layer 220, and source/drain electrodes 260 and 250 coupled to the source/drain regions 223B and 223A. First and second interlayers 225 and 227 exposing the source/drain regions 223B and 223A are formed on the substrate 200 including the gate electrode 230 and a barrier layer 201.

The capacitor Cst is composed of a polycrystalline silicon layer 221 simultaneously formed at the time of forming the active layer 220, a power line 240 formed on the polycrystalline silicon layer 221, and the first interlayer 225 located between the polycrystalline silicon layer and the power line 240. Also, a passivation layer 228 is formed on the thin film transistor TFT and the capacitor Cst.

The organic EL device is composed of a first electrode 270 formed on the passivation layer 228 and electrically contacted to a data electrode 250) of the thin film transistor TFT, an organic emitting layer 272 formed on the first electrode and having a hole injection layer, a hole transport layer, an emission layer, and an electron transport layer, and a second electrode 275 formed thereon and on the entire surface of the substrate. A thin film (not shown), such as a LiF or $LiO_2$ layer, may be interposed between the organic emitting layer 272 and the second electrode 275 so as to easily introduce electrons into the luminescent layer 272. Herein, the first electrode 270 is an anode electrode, and the second electrode 275 is a cathode elect-rode used as a common electrode. The first electrode 270 is formed of one of ITO and IZO, and the second electrode 275 is formed of one of Al, Ca, and Mg.

The packaging layer 300 is formed on the entire surface of the second electrode 275 by first to fourth organic layers 280, 284, 286, and 290, and first and second inorganic layers 282 and 288. Especially, the uppermost layer 290 of the packaging layer 300 contacting the outside is formed of an organic layer to effectively absorb the external impact and increase the adhesion with a polarized film formed thereafter.

Also, the first and second inorganic layers 282 and 288, respectively, formed at lower and upper portions of the first organic layer 284 and the second organic layer 286 in the packaging layer 300 are formed of the same material and have the opposite stresses. Accordingly, the stresses of the inorganic layers 282 and 288 can be offset, thereby preventing the substrate from being bent by the stress of the packaging layer 300. This will be explained in more detail as follows.

Figure 5:
FIG. 5 illustrates a substrate with a tensile stress due to a stress of an inorganic layer when a packaging layer is formed of a single inorganic layer.
Figure 6:
FIG. 6 illustrates a substrate with a compressive stress due to a stress of an inorganic layer when a packaging layer is formed of the single inorganic layer.

Generally, stresses include a tensile stress and a compressive stress according to the characteristics of a material. FIGS. 5 and 6 illustrate examples that a substrate receives a tensile stress and a compressive stress by an inorganic layer formed thereon.

As shown in FIGS. 5 and 6, if the inorganic layer 310 formed on the substrate 320 is formed of a material different from that of the lower substrate 320, the lower substrate 320 tends to have a tensile stress (referring to FIG. 5) or a compressive stress (referring to FIG. 6) by the characteristics of the upper layer 310. However, if the layers having opposite stresses are combined together on the same substrate, the stresses are applied to directions opposite to each other to be attenuated, so that the stresses applied to the substrate are offset.

Accordingly, in the present invention, the first and second inorganic layers 282 and 288 having opposite stresses are respectively formed at lower and upper portions of the second and third organic layers 284 and 286, thereby offsetting the stresses applied to the substrate.

The first and second inorganic layers 282 and 288 are formed of materials, such as SiNx, SiOx, SiOxNx, $Al_2O_3$, and $TiO_2$, and the characteristics of each stress is determined by the conditions in forming the layers.

For example, in case of forming the inorganic layers with SiNx, the inflow amount of $H_2$ is controlled to change the characteristics of the stress.

Figure 7:
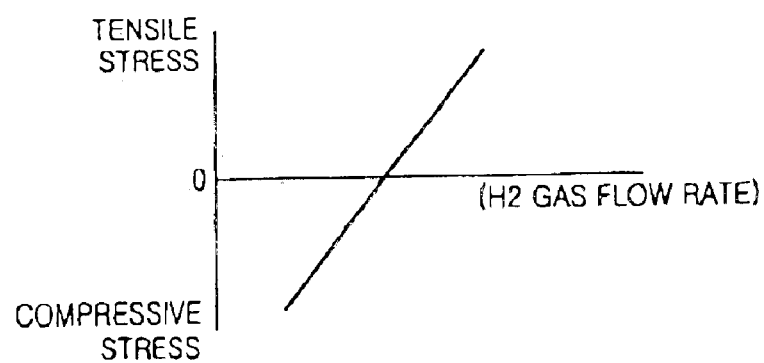
FIG. 7 illustrates a graph showing the change of a stress according to the $H_2$ inflow amount at the time of forming SiNx.

FIG. 7 illustrates a graph showing the change of the stress according to the $H_2$ inflow amount at the time of forming a SiNx layer.

As shown, the SiNx layer is changed in the stress characteristics from the compressive stress to the tensile stress as the $H_2$ inflow amount is increased. Also, at the time of forming the first and second inorganic layers 282 and 288 of the packaging layer, inorganic layers having opposite stresses can be formed on and under the organic layer by controlling the $H_2$ inflow amount.

Also, in the present invention (referring to FIG. 4), the uppermost layer of the packaging layer 300 is formed of the fourth organic layer 290, which can absorb the external impact more effectively than the inorganic layers.

Even though the second and third organic layers 284 and 286 formed between the first and second inorganic layers 282 and 288 are respectively formed of a single layer, they may be formed of more than two layers.

Hereinafter, the fabrication process of the organic electroluminescent display device according to the present invention will be explained with reference to FIGS. 8A to 8E.

Figure 8A:
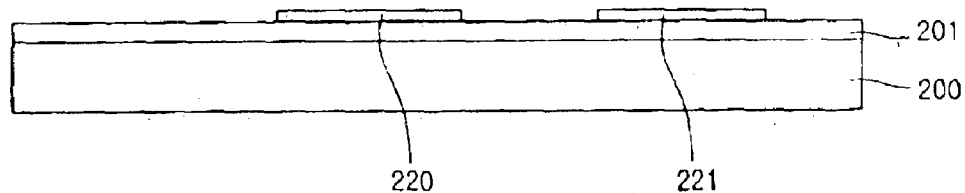
FIGS. 8A to 8E are cross-sectional views illustrating the fabrication process of the organic electro-luminescent display device according to the present invention.

As shown in FIG. 8A, a silicon oxide layer is deposited on the entire surface of the transparent substrate 200 to form a barrier layer 201. The barrier layer 201 is formed to prevent impurities from penetrating into the thin film transistor.

Then, a semiconductor layer is patterned on the barrier layer 201, thereby simultaneously forming an active layer 220 of the thin film transistor and a lower electrode 221 of the capacitor. The active layer 220 is a polycrystalline silicon layer, which can be formed by performing a laser heating process on amorphous silicon.

Figure 8B:
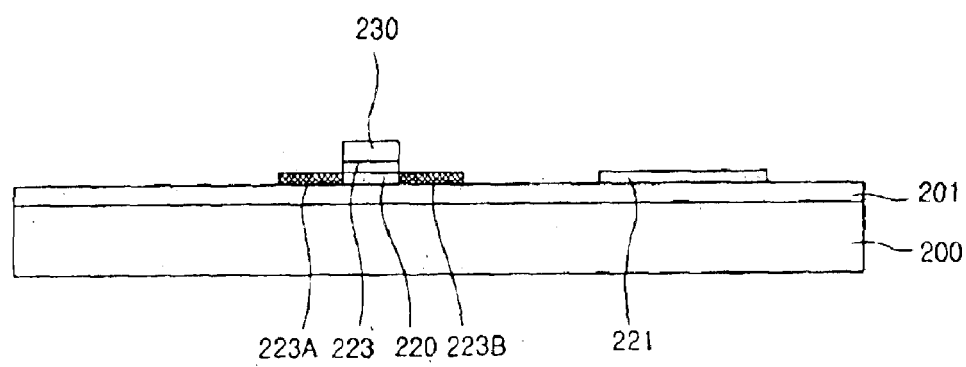

Then, as shown in FIG. 8B, a gate insulation layer 223 is formed at the center region of the active layer 220, and a metal layer is deposited thereon and patterned, thereby forming a gate electrode 230 of the thin film transistor.

Subsequently, impurity ions are injected at the edges of the active layer 220 by using the gate electrode 230 as a mask, thereby forming source and drain regions 223B and 223A.

Figure 8C:
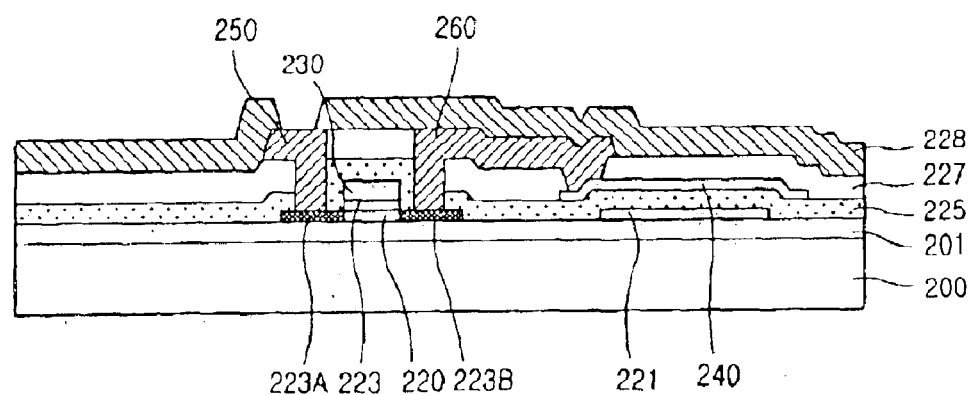

Then, as shown in FIG. 8C, a first interlayer insulation layer 225 is formed on the entire surface of the gate electrode 230, the source and drain regions 223B and 223A of the thin film transistor, and the lower electrode 221 of the capacitor Cst. Next, the power line 240 is formed on the first interlayer insulation layer 225 corresponding to the lower electrode 221, thereby forming a capacitor Cst.

Subsequently, a second interlayer insulation layer 227 is formed on the first interlayer insulation layer 225 including, a power line 240, and then the first and second interlayer insulation layers 225 and 227 are selectively etched, so that portions of the power line 240, the source and drain regions 223B and 223A can be exposed.

Then, the drain electrode 250 is formed to be connected to the drain region 223A, and the source electrode 260 is formed to be extended from the exposed source region 223B to the power line 240.

Then, organic materials, such as BCB or acryl, or inorganic materials, such as SiNx and SiOx, are deposited on the entire surface of FIG. 8C to form a passivation layer 228, and then selectively etched, so that a portion of the drain electrode 250 connected to the drain region 223A can be exposed.

Figure 8D:
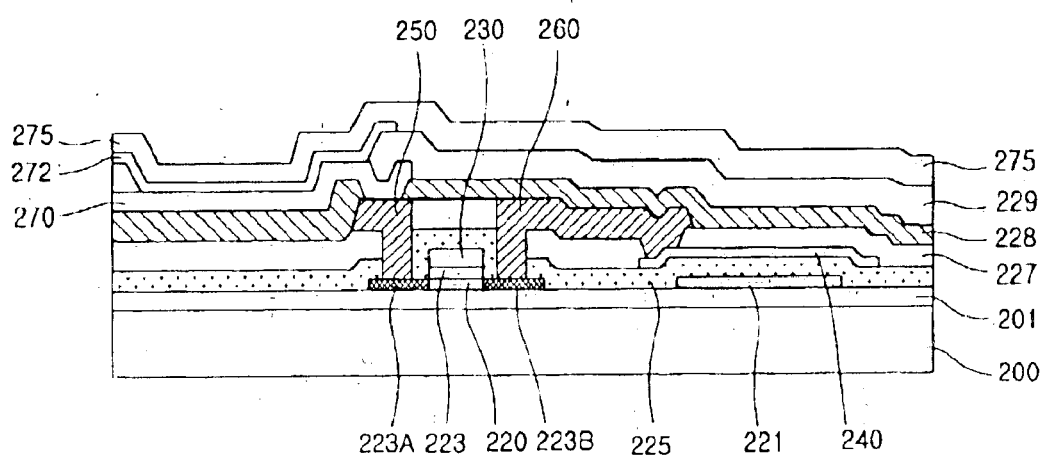

Then, as shown in FIG. 8D, an anode electrode 270 of the organic luminescent device is formed to be connected to the drain electrode 250, and then the third interlayer insulation layer 229. Next, a hole injection layer, a hole transport layer, an organic emitting layer, and an electron transport layer are sequentially deposited on the anode electrode 270 to form an organic emitting layer 272. Then, a cathode electrode 275 is formed over the substrate including the organic emitting layer 272. At this time, a LiF layer or a $LiO_2$ layer (not shown) may be interposed between the organic emitting layer 272 and the second electrode 275.

Figure 8E:
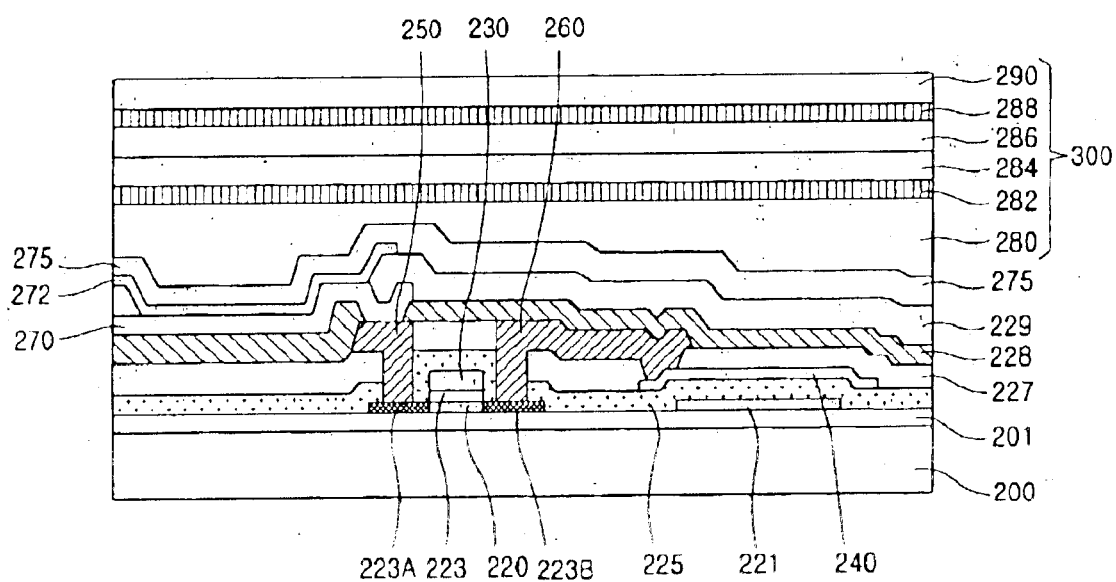

Then, as shown in FIG. 8E, first organic materials 280, such as BCB or acryl, are formed on the entire surface of the cathode electrode 275, and then a first inorganic layer 282, such as SiNx, SiOx, SiOxNy, $Al_2O_3$, and $TiO_2$, is formed thereon.

Next, at least one of first and third organic layers 284 and 286 is formed on the first inorganic layer 282, and then a second inorganic layer 288 formed of the same material as the first inorganic layer 282 is formed. The first and second inorganic layers 282 and 288 have opposite stresses. At this time, if the first inorganic layer 282 has a tensile stress, the second inorganic layer 288 has a compressive stress, and vice versa. Herein, the stress characteristics of the first and second inorganic layers 282 and 288 can be determined by the conditions in forming the layers.

Subsequently, an organic layer 290 is formed on the second inorganic layer 288, thereby forming a packaging layer 300 including the organic layers 280, 284, 286, and 290, and the inorganic layers 282 and 288.

As aforementioned, in the present invention, inorganic layers having opposite stresses are interposed at upper and lower portions of the organic layer in the packaging layer formed by both the inorganic layers and the organic layers, thereby preventing inferiority generated when the substrate is bent by the packaging layer.

In summary, according to the present invention, the inorganic layers having opposite stresses are formed at upper and lower portions of the organic layer in a hermetic structure combined by the organic layers and the inorganic layers as the packaging layer, so that a bend of the substrate is prevented by the stress of the packaging layer. Accordingly, moisture and oxygen from the outside can be minimized, and lines formed on the substrate can be prevented from being cut.

Also, the external impact can be effectively absorbed by forming an organic layer as the most exterior layer.

It will be apparent to those skilled in the art that various modifications and variations can be made in the organic electro-luminescent display device and the method of fabricating the same of the present invention without departing from the spirit or scope of the inventions. Thus, it is intended that the present invention covers the modifications and variations of this invention provided they come within the scope of the appended claims and their equivalents.

What is claimed is:

1. An organic electro-luminescent display device, comprising:
   a plurality of pixels on a substrate;
   a thin film transistor coupled to each pixel;
   an organic electro-luminescent device coupled to the thin film transistor;
   a packaging layer on the organic electro-luminescent device, wherein the packaging layer comprises first and second inorganic layers having opposite stresses; and
   a first organic layer between the first and second inorganic layers.

2. The device of claim 1, wherein the first and the second inorganic layers are formed of a same material.

3. The device of claim 1, wherein the first and second inorganic layers are formed of one of SiNx, SiOx, SiOxNy, $Al_2O_3$, and $TiO_2$.

4. The device of claim 1, wherein the first inorganic layer has a compressive stress with respect to the substrate, and the second inorganic layer has a tensile stress with respect to the substrate.

5. The device of claim 1, wherein the first inorganic layer has a tensile, stress with respect to the substrate, and the second inorganic layer has a compressive stress with respect to the substrate.

6. The device of claim 1, wherein further comprising a second organic layer on the second inorganic layer.

7. The device of claim 6, wherein the second organic layer is formed of one of BCB and acryl.

8. The device of claim 1, wherein the first organic layer is formed of one or more layers.

9. The device of claim 1, wherein the organic electro-luminescent device comprises a first electrode, a second electrode, and an organic emitting layer between the first electrode and the second electrode.

10. The device of claim 9, further comprising one of a LiF layer and a LiO layer between the second electrode and the organic emitting layer.

11. The device of claim 9, wherein the first electrode is formed of a transparent material.

12. The device of claim 11, wherein the transparent material is formed of one of indium tin oxide (ITO) and indium zinc oxide (IZO).

13. The device of claim 9, wherein the second electrode is formed of an opaque material.

14. The device of claim 13, wherein the opaque material is formed of one of Al, Ca, and Mg.

15. An organic electro-luminescent display device, comprising:

a plurality of pixels on a substrate;

a thin film transistor coupled to each pixel, the thin film transistor having a gate electrode, an active layer, and source/drain electrodes;

a capacitor having a power line connected to the source electrode, a polycrystalline silicon layer, and an insulating layer between the source electrode and the polycrystalline silicon layer;

an organic electro-luminescent device having a first electrode connected to the drain electrode, a second electrode over the first electrode, and an organic emitting layer between the first and second electrodes;

a first organic layer on the second electrode;

a first inorganic layer on the first organic layer;

a second organic layer formed of one or more layers on the first inorganic layer;

a second inorganic layer on the second organic layer and formed of a same material as the first inorganic layer, wherein the first and second inorganic layers have opposite stresses; and a third organic layer formed of one or more layers on the second inorganic layer.

16. The device of claim 15, wherein the first inorganic layer has a compressive stress with respect to the substrate, and the second inorganic layer has a tensile stress with respect to the substrate.

17. The device of claim 15, wherein the first inorganic layer has a tensile stress with respect to the substrate, and the second inorganic layer has a compressive stress with respect to the substrate.

18. A method for fabricating an organic electro-luminescent display device comprising:

forming a thin film transistor having an active layer, source/drain electrodes, and a gate electrode, and a storage capacitor having a storage lower electrode, an interlayer insulation layer, and a power line, on a transparent substrate, forming a passivation layer exposing portions of the drain electrode, the source electrode, and the power line;

forming an organic electro-luminescent device having a first electrode, an organic emitting layer, and a second electrode on the passivation layer;

forming a first organic layer on the second electrode;

forming a first inorganic layer on the first organic layer;

forming a second organic layer formed of one or more layers on the first inorganic layer;

forming a second inorganic layer on the second organic layer, the second inorganic layer formed of a same material as the first inorganic layer, wherein the first and second inorganic layers have opposite stresses; and forming a third organic layer formed of one or more layers on the second inorganic layer.

* * * * *